(12) United States Patent
Tiebout

(10) Patent No.: US 7,840,195 B2
(45) Date of Patent: Nov. 23, 2010

(54) MULTIFUNCTION-RF-CIRCUIT

(75) Inventor: Marc Jan Georges Tiebout, Wessling (DE)

(73) Assignee: Infineon Technologies AG, Munich (DE)

(*) Notice: Subject to any disclaimer, the term of this patent is extended or adjusted under 35 U.S.C. 154(b) by 1032 days.

(21) Appl. No.: 11/415,397

(22) Filed: Apr. 28, 2006

(65) Prior Publication Data

US 2007/0252753 A1    Nov. 1, 2007

(51) Int. Cl.
    *H04B 1/04*  (2006.01)
(52) U.S. Cl. .................. 455/118; 455/323; 455/333; 327/102; 327/116
(58) Field of Classification Search ............ 455/313, 455/424, 425, 456.5, 456.6, 501, 550.1, 575.1, 455/561, 63.1, 114.2, 118, 190.1, 217, 253.2, 455/296, 307, 323, 333, 257, 572, 552.1, 455/326; 327/359, 105, 52, 119, 214, 224, 327/272, 274, 389, 102, 116, 552, 553, 558; 330/252, 264, 253, 255, 263, 250, 271, 278; 375/297, 295
See application file for complete search history.

(56) References Cited

U.S. PATENT DOCUMENTS

| | | | | |
|---|---|---|---|---|
| 4,403,198 A * | 9/1983 | Muller | ............... | 330/264 |
| 5,233,311 A * | 8/1993 | Chevallier | ............... | 330/252 |
| 5,444,399 A * | 8/1995 | Shiga | ............... | 327/105 |
| 6,004,255 A * | 12/1999 | Madsen | ............... | 494/54 |
| 6,404,263 B1 * | 6/2002 | Wang | ............... | 327/359 |
| 6,812,771 B1 * | 11/2004 | Behel et al. | ............... | 327/359 |
| 6,946,895 B2 * | 9/2005 | Umeda et al. | ............... | 327/359 |
| 7,373,171 B2 * | 5/2008 | Nakai | ............... | 455/552.1 |
| 2004/0121753 A1 * | 6/2004 | Sugar et al. | ............... | 455/333 |
| 2004/0263255 A1 * | 12/2004 | Morimoto et al. | ............... | 330/286 |
| 2005/0014476 A1 * | 1/2005 | Oono et al. | ............... | 455/118 |
| 2005/0037726 A1 * | 2/2005 | Vice | ............... | 455/326 |
| 2005/0118979 A1 * | 6/2005 | Langenberg et al. | ............... | 455/333 |
| 2005/0164649 A1 * | 7/2005 | Nakatani et al. | ............... | 455/84 |
| 2005/0213672 A1 * | 9/2005 | Lin et al. | ............... | 375/257 |
| 2005/0250463 A1 * | 11/2005 | Koike et al. | ............... | 455/249.1 |
| 2006/0163659 A1 * | 7/2006 | Asano et al. | ............... | 257/357 |
| 2006/0199105 A1 * | 9/2006 | Cahill | ............... | 430/270.11 |
| 2006/0199562 A1 * | 9/2006 | Taylor | ............... | 455/333 |
| 2007/0123314 A1 * | 5/2007 | Ragan | ............... | 455/572 |
| 2008/0116752 A1 * | 5/2008 | Kuroda et al. | ............... | 307/125 |

* cited by examiner

*Primary Examiner*—Duc Nguyen
*Assistant Examiner*—Charles Chow
(74) *Attorney, Agent, or Firm*—Maginot, Moore & Beck

(57) ABSTRACT

A multifunction RF circuit on a single semiconductor chip. The multifunction RF circuit includes a power amplifier circuit, a mixer circuit forming an integral part of the power amplifier circuit and a low-pass filter circuit. The power amplifier circuit may include two amplifier circuits.

16 Claims, 6 Drawing Sheets

MULTIFUNCTION-RF-CIRCUIT

FIELD OF THE INVENTION

The present invention relates to a multifunction RF circuit and to a method of processing RF signals employing a multifunction RF circuit.

BACKGROUND OF THE INVENTION

Radar systems comprising RF-circuits are revelant to a significant number of applications, including those in the automotive field, and to an increasing degree, industrial and consumer applications. A typical operational area includes distance control and surveyance, for example.

Known radar implementations, e.g. based on the FMCW (Frequency Modulated Continuous Wave) method, comprise discrete components exhibiting cross-talk between high frequency signals within the system. Furthermore, assembly and test of known radar systems require effort and general costs.

There is a need, therefore, for methods and apparatus that may assist in reducing cross-talk and/or effort and costs related to radar implementation in various fields of endeavor.

SUMMARY OF THE INVENTION

At least some embodiments of the present invention address one or more of the above-described needs using a multifunction RF circuit and a related method of processing RF signals.

A first embodiment of the present invention is a multifunction RF circuit that includes, on a single semiconductor chip, a power amplifier circuit, a mixer circuit forming an integral part of the power amplifier circuit and a low-pass filter circuit. Other embodiments need not necessarily include all elements on a single semiconductor chip or substrate.

Another embodiment is a method of processing RF signals that includes a step of amplifying a first signal by an amplifier circuit and superimposing the amplified first signal and a further signal at an output of the amplifier circuit. The method also includes employing an element of the amplifier circuit to mix the amplified first signal and the further signal to obtain a mixing signal at the output. The element comprises a non-linear electrical characteristic. The method further includes separating a low-frequency part of the mixing signal from higher frequency parts of the mixing signal, the further signal and the second signal by a low-pass filter circuit.

The above two embodiments may be employed to advantage in a radar system, as will be discussed further below.

The above described features and advantages, as well as others, will become more readily apparent to those of ordinary skill in the art by reference to the following detailed description and accompanying drawings.

DETAILED DESCRIPTION

Figure 1:
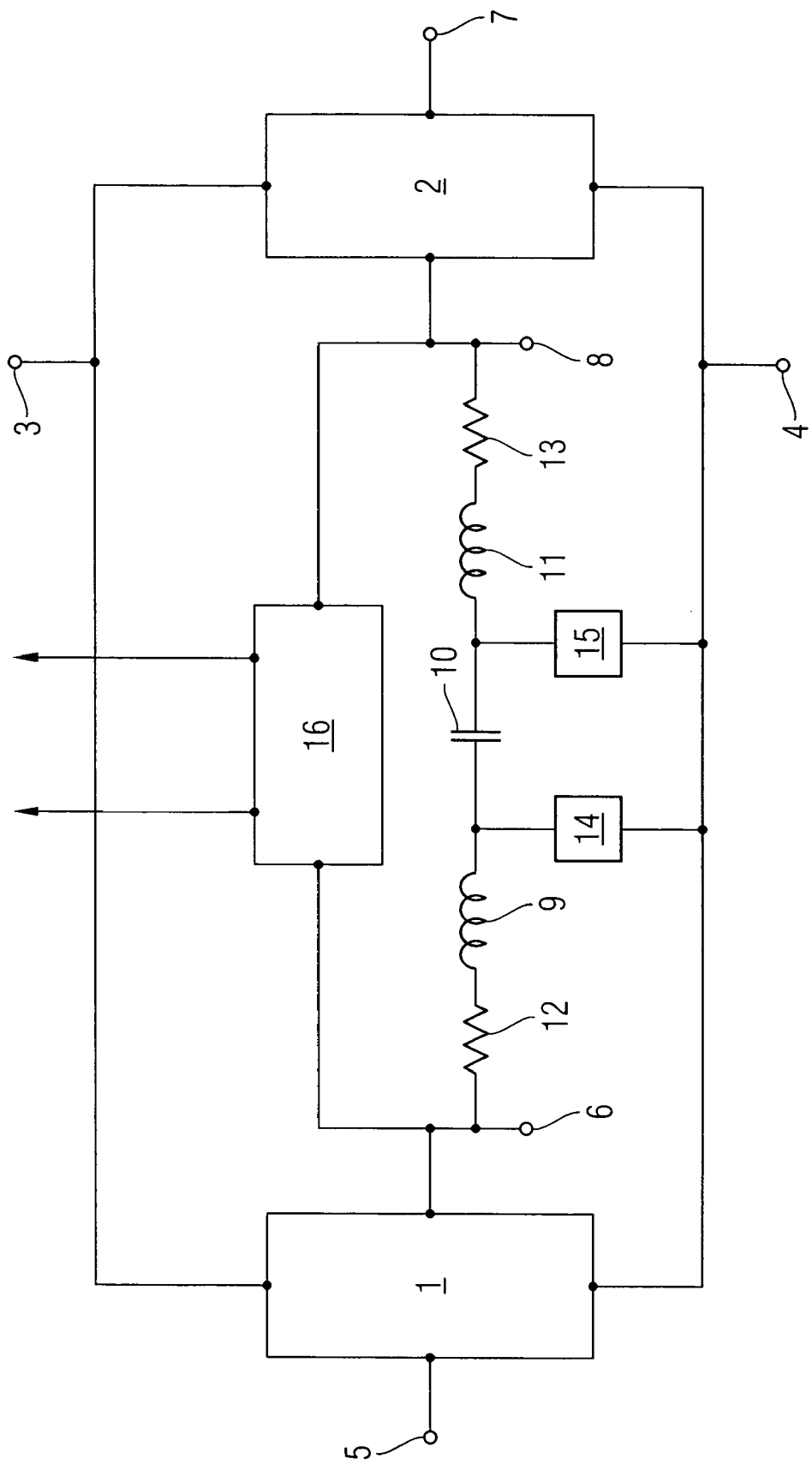
FIG. 1 is a schematic diagram for elucidating the structure of a multifunction-RF-circuit according to a first embodiment of the present invention.

The accompanying drawings are included to provide a further understanding of the present invention and are incorporated in and constitute a part of this specification. The drawings illustrate the embodiments of the present invention and together with the description serve to explain the principles of the invention. Other embodiments of the present invention will be readily appreciated as they become better understood by reference to the following detailed description. The elements of the drawings are not necessarily drawn to scale relative to each other. Like reference numerals designate corresponding similar parts.

According to another embodiment of the invention, a multifunction RF circuit includes a first amplifier circuit having a first input and a first output, and a second amplifier circuit having a second input and a second output. The multifunction RF circuit also includes at least one first inductor, at least one second inductor, at least one capacitor, and a low-pass filter connected, in this sequence, between the first output and the second output. The at least one first inductor is substantially identical to the at least one second inductor, and the low-pass filter is connected to the first output and to the second output.

The first inductor is in some embodiments realized as a conductor comprising a layout corresponding to the layout of the at least one second inductor.

The at least one capacitor is advantageously dimensioned as a capacitor that approximately provides a short circuit, i.e. a very low resistance, with respect to a frequency range of a first signal to be amplified by the amplifying branches, e.g. a RF-signal of a radar system to be transmitted to a target object. Furthermore, the at least one capacitor should also provide a very high resistance with regard to a cut-off frequency of the low-pass filter in order not to attenuate a signal that is to be passed by the low-pass filter. Therefore, the AC (Alternating Current) resistance of the at least one capacitor should be as large as possible with regard to the cut-off frequency.

The first signal to be amplified by the first and second amplifying branches may be generated by a voltage-controlled oscillator, for example. The amplified first signal may be directed to an antenna circuit for sending a transmission signal to a target object and also for receiving a reflection signal from the target object. The reflection signal will be superimposed with the amplified first signal at the outputs of the amplifying branches for further evaluation. Part of the further evaluation may be provided by a mixer circuit forming an integral part of the amplifying branches, for example.

The first amplifying branch and the second amplifying branch may constitute an amplifier circuit, e.g. a differential low noise amplifier (differential LNA).

The cut-off frequency of the low-pass filter is appropriately chosen to separate high-frequency parts of the signals superimposed at the first and second outputs from a low-frequency signal part that is to be evaluated by further circuit components to gain information of a target object detected by a radar system, for example. The low-frequency signal part may comprise signal components generated by a mixer circuit, for example.

It is furthermore advantageous, if the first amplifying branch, the second amplifying branch, the at least one first inductor, the at least one second inductor, the at least one capacitor and the low-pass filter are integrated on a single semiconductor chip. A material of the semiconductor chip may be silicon, for example. However, further materials such as Ge, SiGe, or compound semiconductors (e.g. GaAs) may also be used. The multifunction-RF-circuit may be realized in a CMOS (Complementary Metal-Oxide-Semiconductor) technology, for example. However, further semiconductor technologies that are appropriate for RF-applications may also be used.

It is advantageous if the at least one capacitor comprises a capacity in the range of 1 pF to 200 pF. Thus, it is possible to maintain the amplification characteristics of the amplifying branches and furthermore to avoid a short-circuit with regard to a low-frequency signal to be evaluated within further evaluation stages.

It is also particularly advantageous, if the low-pass filter comprises a cut-off frequency in the range of 1 kHz to 2 GHz. Thus, a low-frequency signal in the range of kHz to MHz may be separated from higher frequency signals in the range of several or several tens of GHz, allowing for a favorable signal processing in radar systems.

It is furthermore advantageous, if the multifunction-RF-circuit comprises at least one first ESD device connected to a node between the at least one first inductor and the at least one capacitor as well as at least one second ESD device connected to a node between the at least one capacitor and the at least one second inductor, wherein the at least one first ESD device is identical with the at least one second ESD device. Thus, the ESD devices are symmetrically positioned between the first output and the second output. Each of the ESD devices may comprise an anode and a cathode and it may be realized of at least one element of the group consisting of diode, transistor and thyristor. In case the ESD device comprises a transistor, the transistor may be a bipolar transistor that is accessed at its base during an ESD event, whereas collector and emitter function as anode and cathode (or vice versa). However, it is also possible to provide a short circuit between the base and one of emitter and collector, thereby providing anode and cathode. It is furthermore possible to use a ggNMOS (grounded gate n-channel MOS)-transistor, the source of which is short-circuited with the well surrounding the source and the drain of which provides a further connection of the ESD device. The at least one first and the at least one second ESD devices may be connected to the respective node with their anodes. However, it is also possible to connect these ESD devices with their cathodes to the respective node. Whether the anode or cathode is connected to the respective node depends upon the circuit path that is to be protected by the respective ESD devices, e. g. the chip pads in-between these ESD devices are connected.

According to a further aspect of the above described embodiment, the multifunction RF circuit includes a resistor that is connected between the first input and the first output as well as a further resistor that is connected between the second input and the second output. These two resistors are identical and provide a feedback between input and output of the amplifying branches in order to adjust an input impedance of the amplifier circuit, for example. Furthermore, these resistors may also improve the linearity of the amplifier circuit.

An advantage of an embodiment of the present invention is achieved by a multifunction-RF-circuit, wherein the first amplifying branch comprises a first transistor and a second transistor, the second transistor being complementary to and connected in series with the first transistor, the first and the second transistor being jointly accessible, the first output being provided between the first and second transistors, and wherein the second amplifying branch comprises a third transistor and a fourth transistor, the fourth transistor being complementary to and connected in series with the third transistor, the third and the fourth transistor being jointly accessible, the second output being provided between the third and fourth transistors.

In some embodiments, the first amplifying branch is identical to the second amplifying branch, and the first and the second amplifying branches are identically connected between a high and a low supply voltage, respectively. Thus, the first transistor is substantially identical to the third transistor and the second transistor is substantially identical to the fourth transistor.

It is furthermore advantageous, if the first transistor and the third transistor are formed as n-channel MOSFETs, and the second transistor as well as the fourth transistor are formed as p-channel MOSFETs.

Alternatively, the first transistor and the third transistor are formed as npn bipolar transistors, and the second transistor as well as the fourth transistor are formed as pnp bipolar transistors.

In case the first to fourth transistors are realized as MOSFETs, a joint access to the first and second transistors or the third and fourth transistors may be provided by connecting the gates of the respective transistors together, for example. In case the first to fourth transistors are realized as bipolar transistors, a joint access to the first and second transistors as well as to the third and fourth transistors may be provided by connecting the bases of the respective transistors together, for example.

It is furthermore advantageous if the at least one capacitor comprises two identical capacitors connected in series, the multifunction-RF-circuit further comprising an additional capacitor, the additional capacitor being connected to a node between the two identical capacitors. The additional capacitor allows for an improvement of the common-mode-stability.

It is particularly advantageous, if the additional capacitor comprises a capacity in a range of 1 pF to 1000 pF.

In some embodiments, the low-pass filter is a LC low-pass filter.

According to other embodiments of the invention, a multifunction RF circuit comprises, on a single semiconductor chip, a power amplifier circuit, a mixer circuit forming an integral part of the power amplifier circuit and a low-pass filter circuit. Thus, elements of the amplifier circuit are shared with the mixer circuit. The power amplifier circuit, the mixer circuit as well as the low-pass filter circuit are preferably connected to a common high-frequency node. Thereby, unwanted cross-talk of high frequency signals between different components within a RF-system, e.g. a radar system, may be reduced or avoided.

It is particularly advantageous, if the mixer circuit comprises a semiconductor element with a non-linear electrical characteristic. Such a semiconductor element may be given by a transistor connected to an output of the power amplifier circuit, for example. Thus, on the one hand, the transistor is involved in the amplification of a high frequency signal. However, a non-linear electrical characteristic is inherent to the transistor with regard to a capacitance between its drain and source region or between its drain and gate region, for example. Thus, on the other hand, signals superimposed at the output of the power amplifier circuit may be mixed by the non-linear element of the transistor, respectively, to provide a mixing signal. Further semiconductor elements providing a non-linear electrical characteristic may also be used.

It is advantageous, if the power amplifier circuit comprises a first amplifying branch comprising a first input and a first output, a second amplifying branch comprising a second input and a second output as well as a further circuit connected between the first output and the second output, the further circuit comprising at least one capacitor, wherein the at least one capacitor is symmetrically connected between the first and the second output.

It is furthermore advantageous, if the at least one capacitor comprises a capacity in the range of 1 pF to 200 pF.

It is particularly advantageous, if the low-pass filter circuit comprises a cut-off frequency in the range of 1 kHz to 2 GHz.

According to a further embodiment of the invention, the mixer circuit shares a transistor with each of the first and second amplifying branches, each of the transistors being connected to the output of the respective amplifying branch.

An advantageous embodiment of the present invention is achieved by a multifunction-RF-circuit, wherein the further circuit further comprises at least one first inductor and at least one second inductor, the at least one first inductor being connected between the first output and the at least one capacitor and the at least one second inductor being connected between the second output and the at least one capacitor, and wherein the at least one first inductor is identical with the at least one second inductor.

It is furthermore advantageous, if the first amplifying branch is identical with the second amplifying branch, and the first and second amplifying branches are identically connected between a high and a low supply voltage.

It is furthermore advantageous, if the low-pass filter circuit is a LC low-pass filter circuit.

It is furthermore advantageous, if the further circuit comprises at least one ESD device symmetrically connected between the first output and the second output.

According to a further embodiment of the invention, there is provided a multifunction RF circuit comprising means for amplifying a first signal comprising a frequency within a first frequency range, means for generating a mixing signal based on the first signal and a further signal, the further signal comprising a frequency within the first frequency range, the mixing signal comprising a mixing signal component within a further frequency range, the further frequency range lying below the first frequency range, the mixing signal generating means forming an integral part of the amplifying means, and wherein the first signal, the further signal as well as the mixing signal are superimposed at the output of the amplifying means, and means for low-pass filtering to separate the mixing signal component from higher frequency components of the mixing signal, the first signal as well as the further signal. The first frequency range may be a RF-frequency range of the first signal that is to be transmitted by a radar system to a target object, for example. The further signal may be a reflection signal of the target object. The first signal range may be within one GHz to several hundreds of GHz, wherein the further frequency range may be within a range of kHz to MHz, for example.

It is furthermore advantageous, if the amplifying means comprises a first amplifying branch comprising a first input and a first output as well as a second amplifying branch comprising a second input and a second output. Thus, a differential low noise amplifier can be realized.

In certain embodiments, the first amplifying branch is identical to the second amplifying branch, and the first and second amplifying branches are identically connected between a high and a low supply voltage, respectively.

It is furthermore advantageous, if the amplifying means further comprises means for inductively coupling the first output with the second output, and means for providing an AC resistance between the first and second outputs that is smaller with respect to the first frequency range compared to the further frequency range. Latter means may be a capacitor, for example. The capacitor may be appropriately chosen to maintain the amplification characteristic of the amplifying means within the first frequency range, but, in addition, to avoid a short-circuit between the first and the second outputs of the amplifying means with regard to signals within the further frequency range.

It is particularly advantageous, if the multifunction-RF-circuit further comprises protection means connected to the inductive coupling means for providing current paths conducting electrostatic discharge currents.

It is particularly advantageous, if the multifunction-RF-circuit further comprises means for capacitive stabilizing common mode rejection of the amplifying means, one contact of the capacitive stabilizing means being connected to a node within the inductive coupling means. The capacitive stabilizing means may be further connected to a low supply voltage with another of its contacts.

According to a further embodiment of the invention, there is provided a method of processing RF signals comprising the steps of amplifying a first signal by an amplifier circuit, superimposing the amplified first signal and a further signal at an output of the amplifier circuit, employing an element of the amplifier circuit to mix the amplified first signal and the further signal to obtain a mixing signal at the output, the element comprising a non-linear electrical characteristic, and separating a low-frequency part of the mixing signal from higher frequency parts of the mixing signal, the first signal and the further signal by a low-pass filter circuit. The method may be used in a radar system to gain information of a target object. The first signal may be transmitted by means of an antenna, for example, to the target object, wherein the further signal may be a reflection signal from the target object.

It is particularly advantageous, if a transistor device is employed as the element. A non-linear electrical characteristic is inherent to the transistor element due to a non-linear capacitance of its drain/source junction as well as its drain/gate junction, in case the transistor is realized as a MOSFET. In case the transistor is realized as a bipolar transistor, the non-linear electrical characteristic may be provided by a non-linear capacitance between emitter and collector, for example.

It is particularly advantageous, if the amplifier circuit is formed as a differential amplifier circuit. The differential amplifier circuit may be a low noise amplifier, for example.

In the following reference is again taken to the Figures:

FIG. 1 shows a schematic diagram of a multifunction-RF-circuit according to a first embodiment of the invention. The multifunction-RF-circuit as well as the embodiments shown in FIGS. 2-6 may be part of a radar system, for example.

With reference to FIG. 1, the multifunction-RF-circuit comprises a first amplifying branch 1 as well as a second amplifying branch 2. Both amplifying branches 1, 2 are identically connected between a high supply voltage 3 and a low supply voltage 4. The first amplifying branch comprises a first input 5 as well as a first output 6. Likewise, the second amplifying branch 2 comprises a second input 7 as well as a second output 8.

Between the first output 6 and the second output 8 there is provided, in this order, a first inductor 9, a capacitor 10 as well as a second inductor 11, the second inductor 11 being identical with the first inductor 9, e.g. both inductors comprising an identical layout. Parasitic resistors of the first and second inductors 9, 11 are denoted by reference numerals 12, 13, respectively. A first ESD device 14 is connected between the low supply voltage 4 and a node in-between the first inductor 9 and the capacitor 10. A second ESD device 15 is connected between the low supply voltage 4 and a node in-between the second inductor 11 and the capacitor 10. Thus, an impedance between the second output 8 and the low supply voltage 4 equals the impedance between the first output 6 and the low supply voltage 4. In case of an ESD event impinging a discharge current to the first output or the second output, the first and second ESD devices 14, 15 do provide a current discharge path to the low supply voltage in order to protect further circuitry connected to the outputs 6, 8, e.g. the amplifying branches.

A low-pass filter circuit 16 is connected to the first output 6 and to the second output 8. Further circuits may be connected to this multifunction-RF-circuit, e.g. to build up a radar system. To give an example, such further circuits may include an A/D converter connected to the low-pass filter 16 as well as an antenna circuit connected to the first and second outputs 6, 8. Furthermore, a voltage controlled oscillator may be connected to the first and second inputs 5, 7 to provide a signal that is to be amplified.

Each of the first and second amplifying branches 1, 2 may also comprise a mixer circuit connected to the respective first or second output 6, 8. The mixer circuit may provide a mixing signal based on signal components superimposed at the respective output.

The capacitor 10 is suitably dimensioned in a way that it approximately provides an AC short-circuit, i.e. a low AC resistance when amplifying a first signal by means of the first and second amplifying branches 1, 2, thereby maintaining the amplification characteristic. Furthermore, the capacitor 10 should avoid an AC short-circuit with respect to a low-frequency part of a mixing signal occurring at the first and second outputs 6, 8. A cut-off frequency of the low-pass filter 16 will be appropriately selected in order to separate a low-frequency part of the mixing signal comprising information content, e.g. with regard to a target object, from higher frequency components of the mixing signal and further signals superimposed at the outputs 6, 8.

Figure 2:
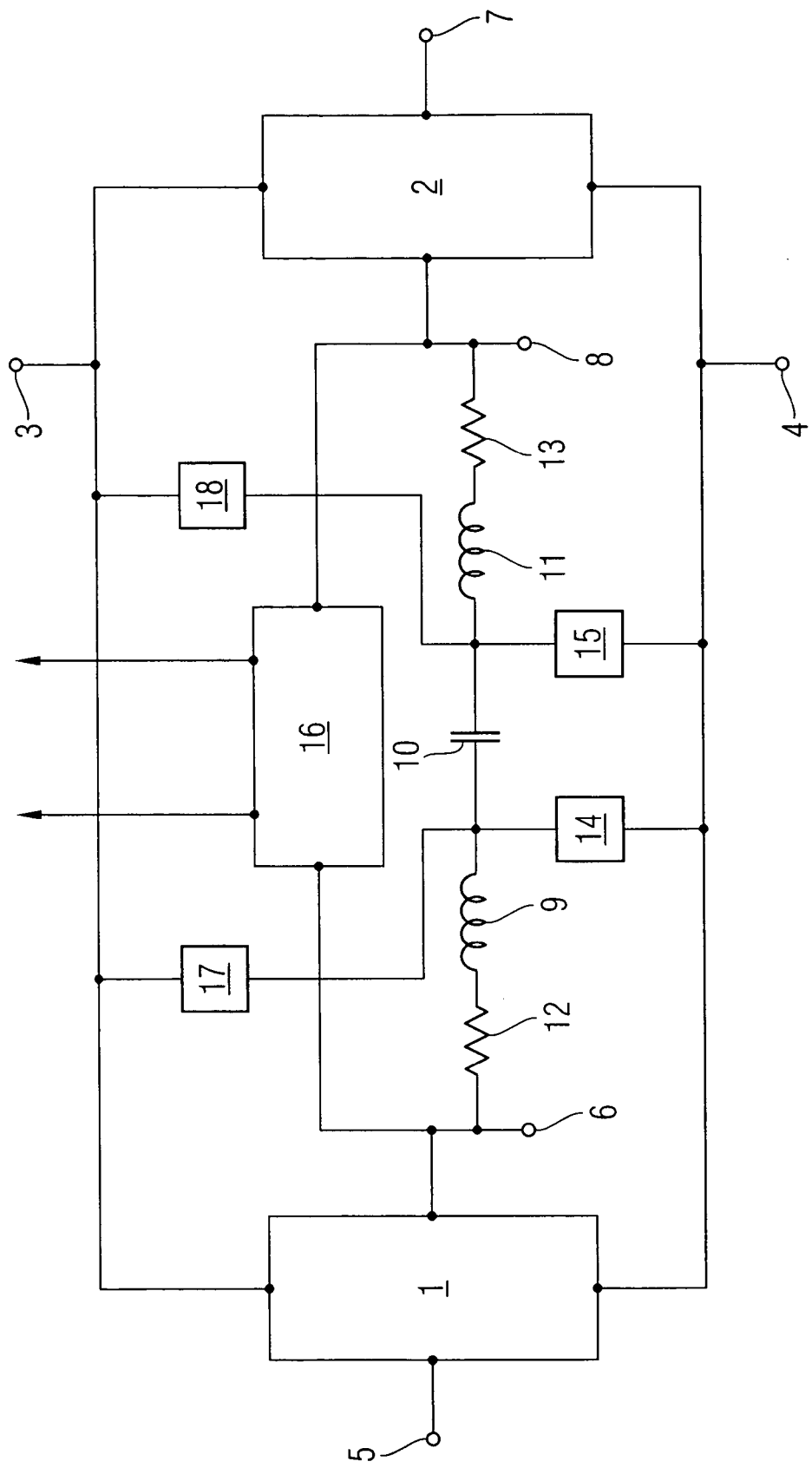
FIG. 2 is a schematic diagram for elucidating the structure of a multifunction-RF-circuit according to a second embodiment of the present invention.

Reference is now taken to FIG. 2, showing a schematic structure of a multifunction-RF-circuit according to a second embodiment of the invention. Circuit components of this second embodiment that correspond to respective components of the first embodiment shown in FIG. 1 are denoted with like reference numerals and a further description thereof will be omitted. Instead, reference is taken to respective description parts of the first embodiment. However, the second embodiment shown in FIG. 2 differs from the first embodiment shown in FIG. 1 in that a third ESD device 17 is connected between the high supply voltage 3 and a node in-between the inductor 9 and the capacitor 10. Furthermore, a fourth ESD device 18 is provided between the high supply voltage 3 and a node in-between the second inductor 11 and the capacitor 10. It is to be noted that the third ESD device 17 is identical with the fourth ESD device 18. It is, however, not necessary that the first and second ESD devices 14 and 15 agree with the third and fourth ESD device's 17, 18, although these devices 14, 15, 17, 18 may coincide. The second embodiment provides a more advanced ESD protection concept compared to the first embodiment shown in FIG. 1 as there is also provided a discharge path via the third and fourth ESD devices 17, 18 being effective in case of ESD discharge between pads of the first and second outputs 6, 8 and the high supply voltage 3, for example.

Figure 3:
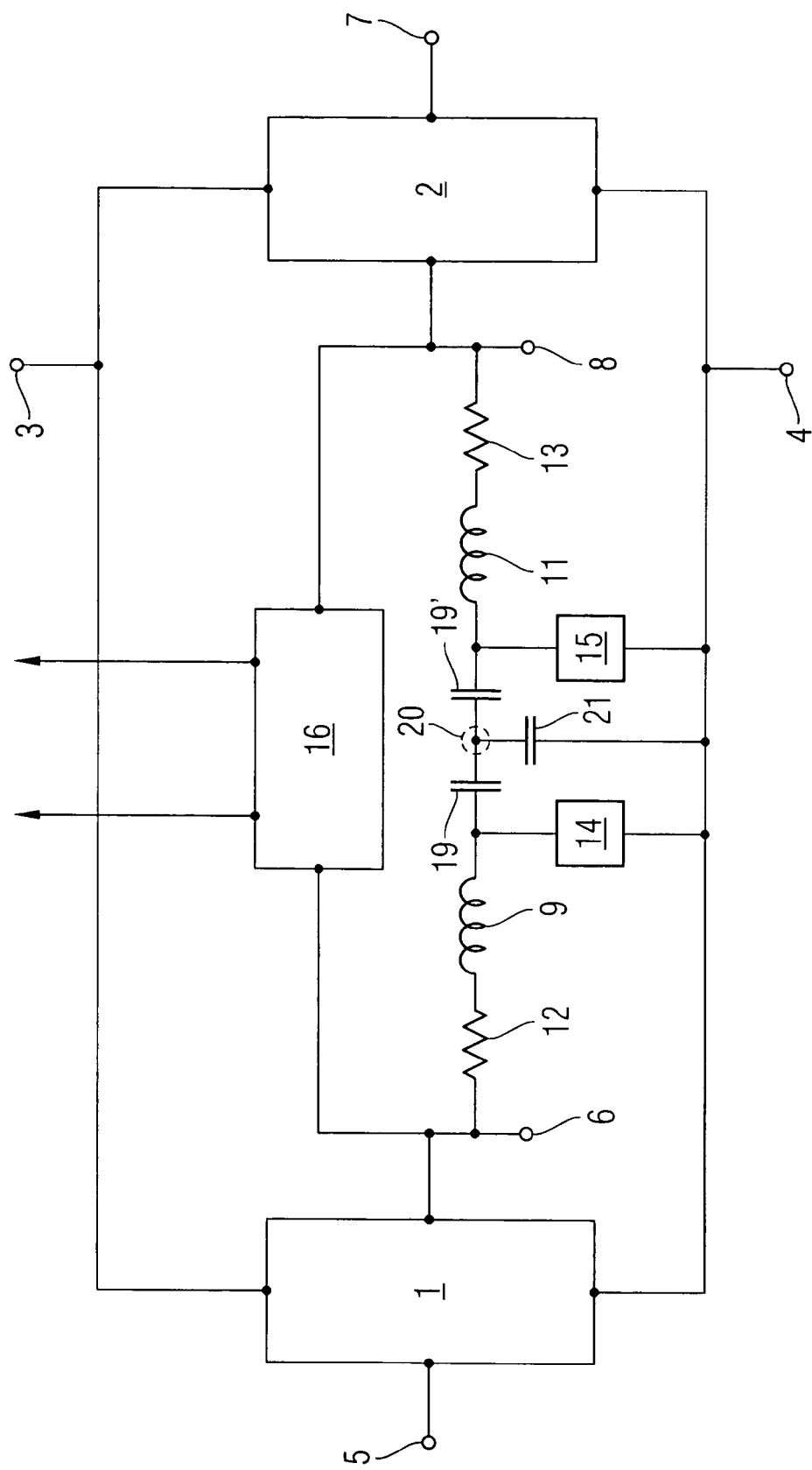
FIG. 3 is a schematic diagram for elucidating the structure of a multifunction-RF-circuit according to a third embodiment of the present invention.

Reference is now taken to FIG. 3 showing a schematic diagram of a multifunction-RF-circuit according to a third embodiment of the invention. Again, circuit components of this third embodiment that correspond to respective components of the first embodiment are designated by like reference numerals and a repetition of their description is omitted. Instead, reference is taken to respective description parts of the first embodiment. Differing from the first embodiment shown in FIG. 1, the third embodiment comprises a serial connection of two identical capacitors 19, 19' connected between the first inductor 9 and the second inductor 11. Between those two identical capacitors 19, 19' there is located a node of AC ground 20. This node, lying symmetrically between the first and second outputs 6, 8, does not experience a voltage shift with respect to varying AC signals between the first and second inputs 5, 6. Furthermore, there is connected a further capacitor 21 between the node of AC ground 20 and the low supply voltage 4. The further capacitor allows for an improvement of common-mode-stability and in the embodiment described herein lies within a range of 1 pF to 1000 pF.

Figure 4:
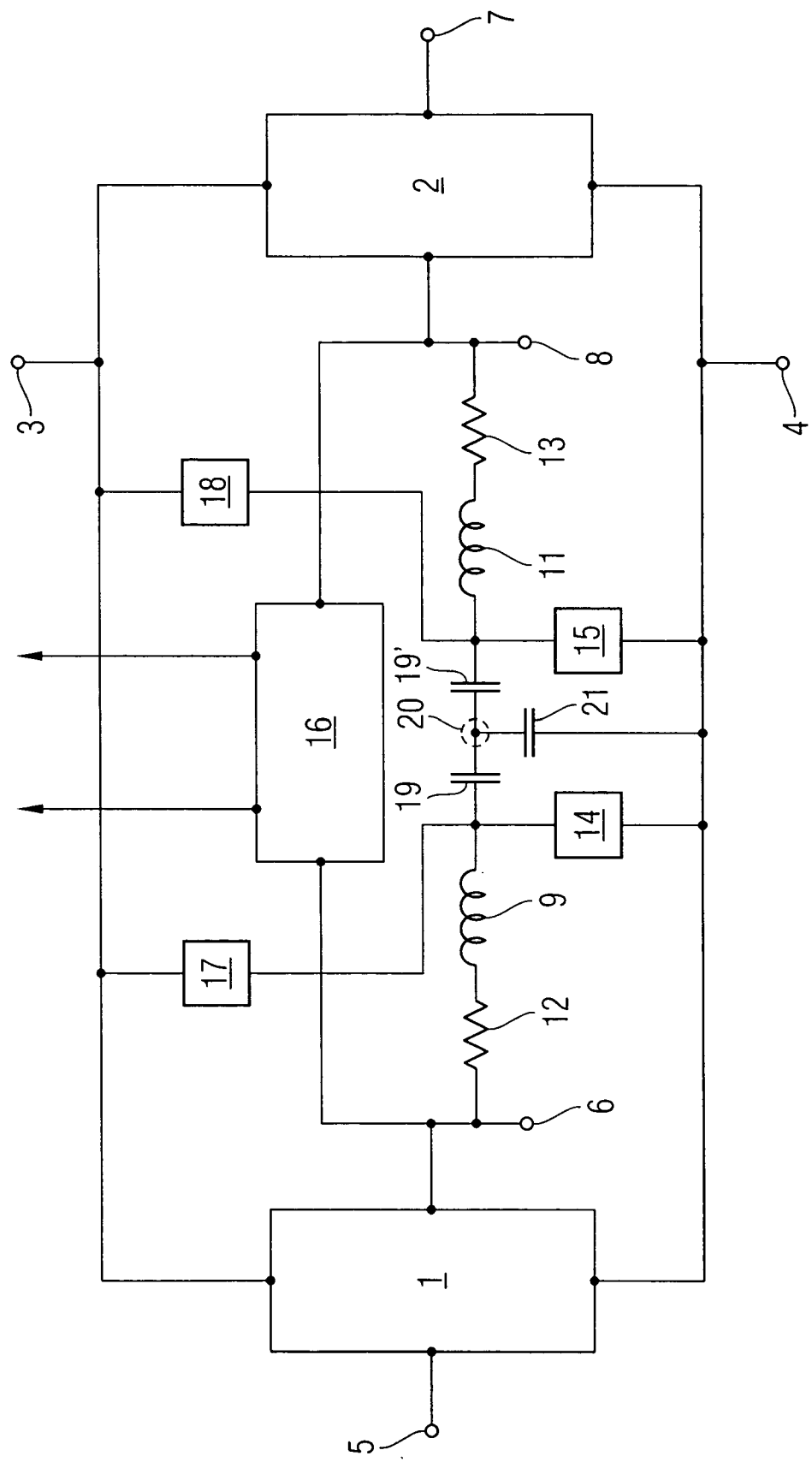
FIG. 4 is a schematic diagram for elucidating the structure of a multifunction-RF-circuit according to a fourth embodiment of the present invention.

Reference is now taken to FIG. 4 showing a schematic diagram of a multifunction-RF-circuit according to a fourth embodiment of the present invention. Again, circuit components of the fourth embodiment that correspond to respective components of the first or third embodiment are denoted by like reference numerals and a repetition of their description is omitted. Instead, reference is taken to the respective description parts of the first and third embodiment (see also FIGS. 1, 3). The fourth embodiment differs from the third embodiment shown in FIG. 3 in that a third ESD device 17 is connected between the high supply voltage 3 and a node in-between the inductor 9 and the capacitor 19. Furthermore, a fourth ESD device 18 is provided between the high supply voltage 3 and a node in-between the second inductor 11 and the capacitor 19'. It is to be noted that the third ESD device 17 is identical with the fourth ESD device 18. It is, however, not necessary that the first and second ESD devices 14 and 15 agree with the third and fourth ESD devices 17, 18, although these devices 14, 15, 17, 18 may coincide. The second embodiment provides a more advanced ESD protection concept compared to the first embodiment shown in FIG. 1 as there is also provided a discharge path via the third and fourth ESD devices 17, 18 being effective in case of ESD discharge between pads of the first and second outputs 6, 8 and the high supply voltage 3, for example.

Figure 5:
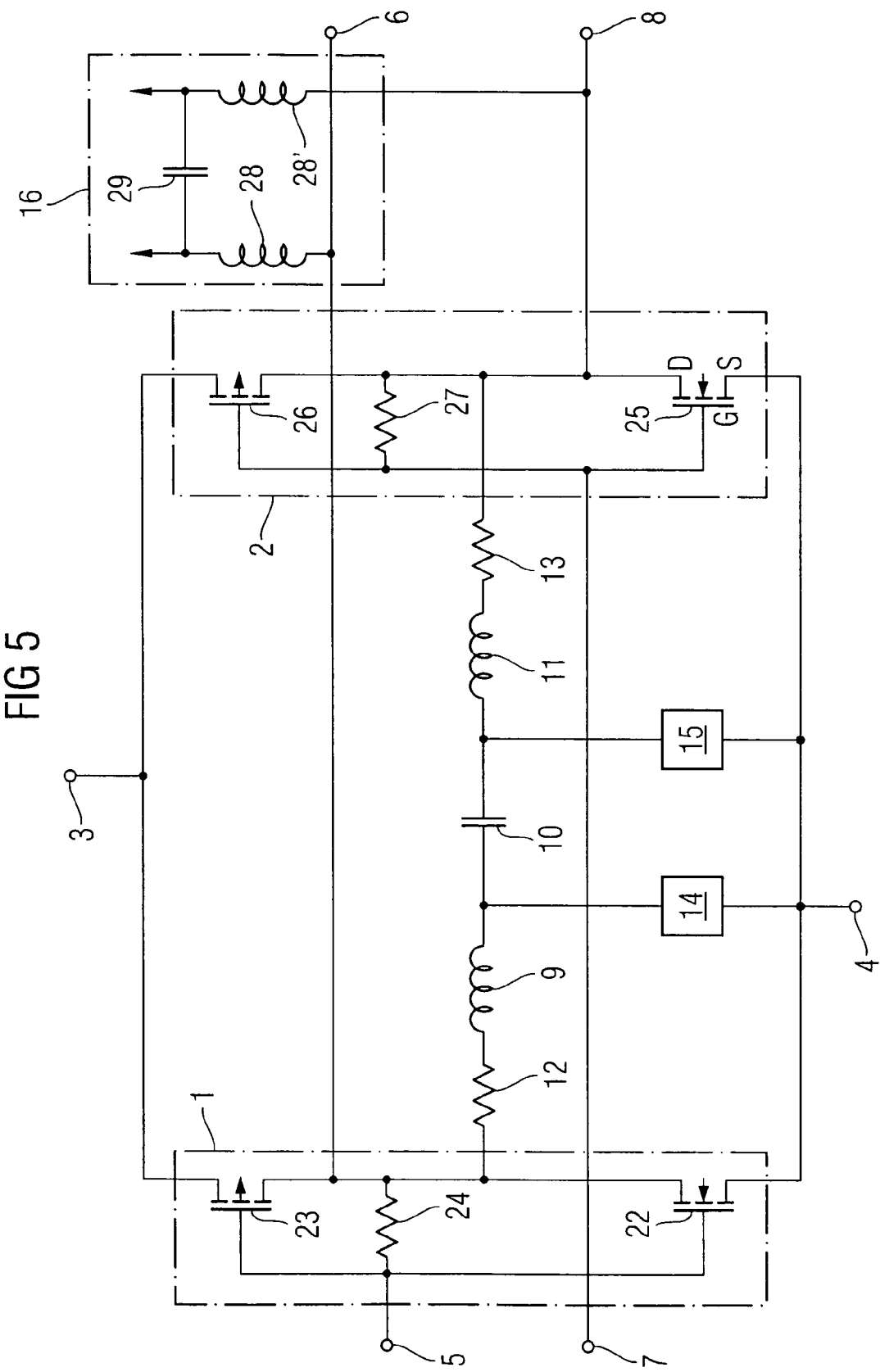
FIG. 5 is a schematic diagram for elucidating the structure of a multifunction-RF-circuit according to a fifth embodiment of the present invention.

Reference is now taken to FIG. 5 showing a schematic diagram of a multifunction-RF-circuit according to a fifth embodiment of the present invention.

The fifth embodiment corresponds, in principle, to the first embodiment. However, circuit details with respect to the first amplifying branch 1, the second amplifying branch 2 and the low-pass filter circuit 16 are provided.

In this regard, the first amplifying branch 1 comprises a n-channel MOSFET as a first transistor 22 and a p-channel MOSFET as a second transistor 23. Both transistors 22, 23 are connected in series between the high supply voltage 3 and the low supply voltage 4. To be more specific, a source of the first transistor 22 is connected to the low supply voltage 4, a drain of the first transistor 22 is connected to the drain of the transistor 23. The source of the transistor 23 is connected to the high supply voltage 3. A gate of the first transistor 22 is directly connected to the gate of the second transistor 23. Thus, both transistors 22 and 23 are accessible by their gates via the first input 5. A resistor 24 is connected between the first input 5 and the first output 6, whereas the first output 6 lies in-between the first and second transistors 22, 23. It is to be noted that a connection between the first amplifying branch 1 and any one of the supply voltages 3, 4 may comprise further circuit components (not shown). This also holds true for the other embodiments.

The second amplifying branch 2 is, compared to the first amplifying branch 1, identically connected between the high supply voltage 3 and the low supply voltage 4. The second amplifying branch 2 comprises a n-channel MOSFET as a third transistor 25, a p-channel MOSFET as a fourth transistor 26 as well as a further resistor 27. The circuit elements 25, 26, 27 are not only identical with the circuit elements 22, 23, 24, respectively, but they are also arranged in the same manner.

The low-pass filter circuit 16 is formed as a LC low-pass filter circuit comprising two identical inductors 28, 28' as well as a filter capacitor 29.

It is to be noted that the first and third transistors 22, 25 function, apart from amplifying a signal input at the first and second input 5, 7, as mixer elements to provide a mixing signal with regard to superimposed signals at the first and second outputs 6, 8. These superimposed signals may include a first signal transmitted to a target object as well as a further signal that corresponds to a reflection signal from the target object, for example. The mixing signal provided by the first and third transistors 22, 25 at the respective outputs 6, 8 may comprise a low-frequency component corresponding to a difference frequency of the first signal and the further signal. This low-frequency component may be separated by higher-frequency components at the outputs 6, 8 by the low-pass filter 16. Therefore, a cut-off frequency of the low-pass filter 16 may be appropriately chosen.

The first output 6 corresponds to a high-frequency node common to the first amplifying branch 1, mixer element, i.e. first transistor 22 and the low-pass filter circuit 16. The same holds true for elements 6, 2, 25, 16. Thus, unwanted cross-talk between high frequency signals of an amplifier and a mixer in a radar system may be avoided.

Figure 6:
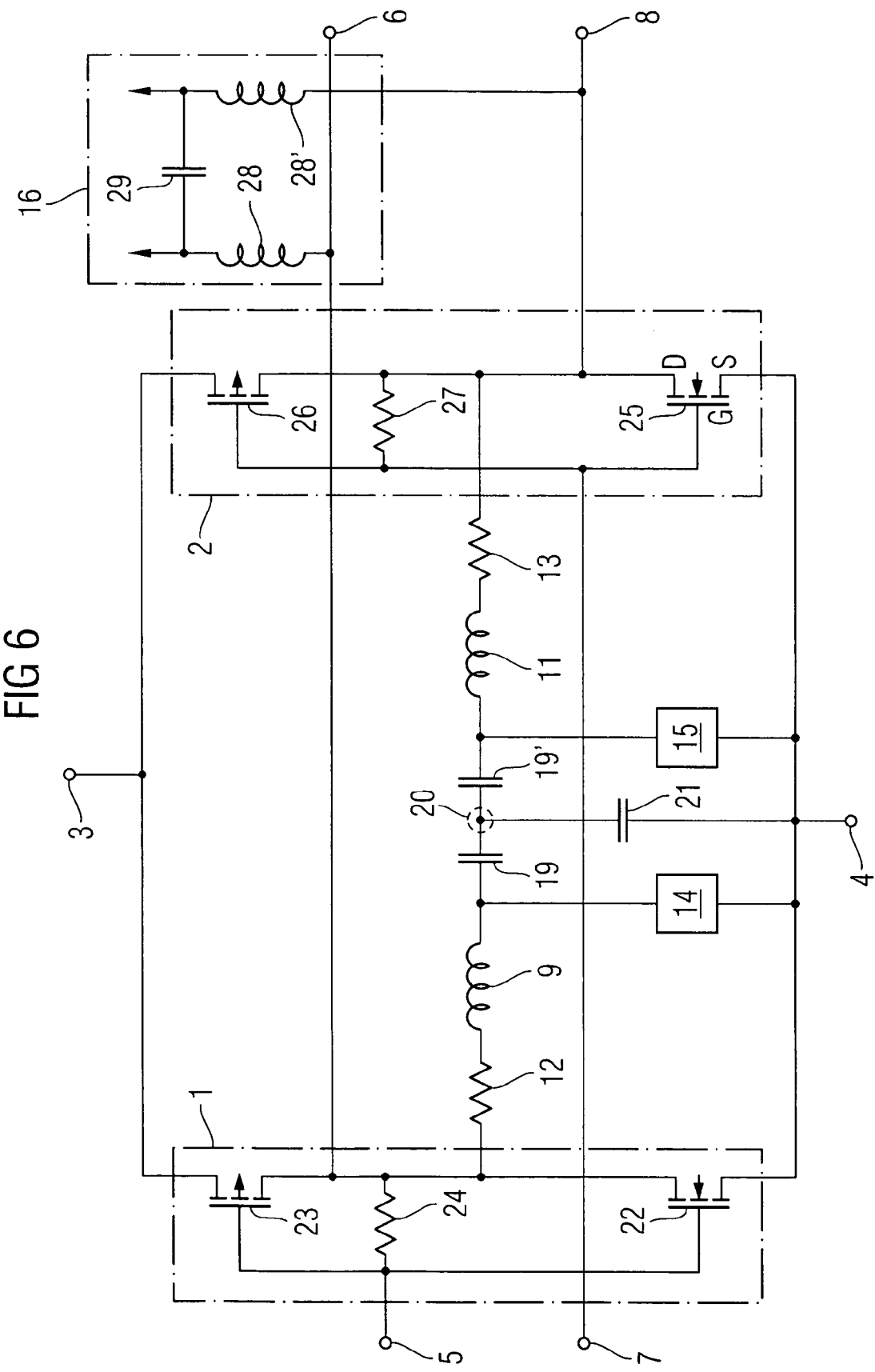
FIG. 6 is a schematic diagram for elucidating the structure of a multifunction-RF-circuit according to a sixth embodiment of the present invention.

Reference is now taken to FIG. 6 showing a schematic diagram of a multifunction-RF-circuit according to a sixth embodiment of the invention. Circuit elements of this embodiment that correspond to respective circuit elements of the fifth or first embodiment (see FIG. 5 and FIG. 1) are denoted by like reference numerals and a description thereof is omitted. Instead, reference is taken to respective description parts of the first and fifth embodiments. Differing from the fifth embodiment shown in FIG. 5, the sixth embodiment comprises a serial connection of two identical capacitors 19, 19' connected between the first inductor 9 and the second inductor 11. Between those two identical capacitors 19, 19' there is located a node of AC ground 20. This node, lying symmetrically between the first and second outputs 6, 8, does not experience a voltage shift with respect to varying AC signals between the first and second inputs 5, 6. Furthermore, there is connected a further capacitor 21 between the node of AC ground 20 and the low supply voltage 4. The further capacitor allows for an improvement of common-mode-stability and in the embodiment described herein lies within a range of 1 pF to 1000 pF.

The invention claimed is:

1. A multifunction RF circuit comprising, on a single semiconductor chip, a power amplifier circuit, a mixer circuit forming an integral part of said power amplifier circuit and a low-pass filter circuit;
    wherein said power amplifier circuit comprises a first amplifying branch comprising a first input and a first output, and a second amplifying branch comprising a second input and a second output;
    wherein said first amplifier circuit includes a first shared transistor operably connected between the first input and the first output and a first resistor connected between the first input and the first output and said second amplifying branch includes a second shared transistor operably connected between said second input and said second output and a second resistor connected between the second input and the second output, said first and second shared transistors being configured to amplify signals received at the first and the second inputs, respectively, said first and second shared transistors each including an n-channel MOSFET and a p-channel MOSFET,
    wherein a further circuit comprising a series connection of a first inductor, a capacitor and a second inductor is connected between said first output and said second output, and
    wherein said mixer circuit includes said first shared transistor and said second shared transistor, said first and second shared transistors being configured to generate mixing signals at the first and the second outputs, respectively, said mixing signals being based on said signals received at the first and the second inputs, respectively.

2. The multifunction RF circuit according to claim 1, wherein said mixer circuit comprises a semiconductor element with a nonlinear electrical characteristic.

3. The multifunction RF circuit according to claim 2, further comprising:
    a further circuit connected between said first output and said second output, said further circuit comprising a capacitor, wherein said at least one capacitor is symmetrically connected between said first and said second output, the capacitor including a first terminal connected to the at least one first inductor and a second terminal connected to the at least one second inductor.

4. The multifunction RF circuit according claim 3, wherein said at least one capacitor comprises a capacity in the range of 1 pF to 200 pF.

5. The multifunction RF circuit according to claim 4, wherein said low-pass filter circuit comprises a cut-off frequency in the range of 1 kHz to 2 GHz.

6. The multifunction RF circuit according to claim 5, wherein said first inductor is identical with said second inductor.

7. The multifunction RF circuit according to claim 6, wherein said first amplifying branch is identical with said second amplifying branch, and said first and said second amplifying branches are identically connected between a high and a low supply voltage.

8. The multifunction RF circuit according to claim 7, wherein said low-pass filter circuit is a LC low-pass filter circuit.

9. The multifunction RF circuit according to claim 8, wherein said further circuit comprises at least one ESD device symmetrically connected between said first output and said second output.

10. The multifunction RF circuit comprising:
    means for amplifying a first signal comprising a frequency within a first frequency range, said means comprising at least one transistor;
    means for generating a mixing signal based on said first signal and a further signal, said further signal comprising a frequency within said first frequency range, said mixing signal comprising a mixing signal component within a further frequency range, said further frequency range lying below said first frequency range, said mixing signal generating means forming an integral part of said amplifying means, and wherein said first signal, said further signal as well as said mixing signal are superposed at the output of said amplifying means; and means for low-pass filtering to separate said mixing signal component of said mixing signal from higher frequency components of said mixing signal, said first signal as well as said further signal;

wherein said mixing signal generating means employs said at least one transistor to generate said mixing signal and to superpose said mixing signal and said further signal at the output of said amplifying means;

wherein said amplifying means includes a first amplifying branch comprising a first input and a first output and a second amplifying branch comprising a second input and a second output;

wherein said at least one shared transistor comprises a first shared transistor and a second shared transistor, said first and second shared transistors being configured to amplify signals received at the first and the second inputs, respectively, said first and second shared transistors each including an n-channel MOSFET and a p-channel MOSFET wherein said first amplifying branch shared includes said first shared transistor operably connected between the first input and the first output and a first resistor connected between the first input and the first output of the first amplifier branch;

wherein said second amplifying branch includes said second shared transistor operably connected between said second input and said second output and a second resistor connected between the second input and the second output, wherein a further circuit comprising a series connection of a first inductor, a capacitor and a second inductor is connected between said first output and said second output, and wherein said mixing signal generating means includes said first shared transistor and said second shared transistor, said first and second shared transistors being configured to generate mixing signals at the first and the second outputs, respectively, said mixing signals being based on said signals received at the first and the second inputs, respectively.

11. The multifunction RF circuit according to claim 10, wherein said first amplifying branch is identical to said second amplifying branch, and said first and second amplifying branches are identically connected between a high and a low supply voltage, respectively.

12. The multifunction RF circuit according to claim 11, further comprising means for providing an AC resistance between said first and second outputs that is smaller with respect to said first frequency range compared to said further frequency range.

13. The multifunction RF circuit according to claim 12, further comprising protection means connected to said inductive coupling means for providing current paths conducting electrostatic discharge currents.

14. The multifunction RF circuit according to claim 13, further comprising means for capacitive stabilizing common mode rejection of said amplifying means, one contact of said capacitive stabilizing means being connected to a node within said inductive coupling means.

15. Method of processing RF signals comprising the steps of:

amplifying a first signal using a first amplifying branch of an amplifier circuit, said first amplifying branch comprising a first input and a first output, said first signal being received at the first input, said first amplifier branch including a first shared transistor and a first resistor connected between said first input and said first output, said first shared transistor being configured to amplify said first signal;

amplifying a further signal using a second amplifying branch of said amplifier circuit, said second amplifying branch comprising a second input and a second output, said further signal being received at the second input, said second amplifier branch including a second shared transistor and a second resistor connected between said second input and said second output, said second shared transistor being configured to amplify said further signal; wherein said first and second shared transistors each include an n-channel MOSFET and a p-channel MOSFET; and wherein a further circuit comprising a series connection of a first inductor, a capacitor and a second inductor is connected between said first output and said second output, superimposing said amplified first signal and said further signal at an output of said amplifier circuit;

employing said first and second shared transistors of said amplifier circuit to mix said amplified first signal and said further signal to obtain a mixing signal at said output, said first and second shared transistors each having a non-linear electrical characteristic; and separating a low-frequency part of said mixing signal from higher frequency parts of said mixing signal, said first signal and said further signal by a low-pass filter circuit.

16. Method according to claim 15, wherein said amplifier circuit is formed as a differential amplifier circuit.

* * * * *